(12) United States Patent
Fukatsu et al.

(10) Patent No.: US 6,434,006 B1
(45) Date of Patent: Aug. 13, 2002

(54) SEMICONDUCTOR DEVICE HAVING HEAT RADIATING MEMBER

(75) Inventors: Akihiro Fukatsu, Anjo; Kan Kinouchi, Okazaki; Mitsuhiro Saito, Obu; Yoshiharu Harada, Okazaki, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/846,363

(22) Filed: May 2, 2001

(30) Foreign Application Priority Data

May 12, 2000 (JP) ........................... 2000-140554
Mar. 14, 2001 (JP) ........................... 2001-072444

(51) Int. Cl.[7] .................................. H05K 7/20
(52) U.S. Cl. ................. 361/704; 361/705; 361/707; 361/708; 361/719; 361/720; 257/717; 257/718; 257/719; 174/16.3; 165/80.2; 165/80.3; 165/185
(58) Field of Search ................. 361/704, 707, 361/709, 710, 712–721; 174/16.3, 16.1; 257/712, 717–719, 722; 165/80.2, 80.3, 185

(56) References Cited

U.S. PATENT DOCUMENTS

| 4,151,547 | A | * | 4/1979 | Rhoades et al. ............. 257/718 |
| 4,384,610 | A | * | 5/1983 | Cook et al. ................. 165/80.2 |
| 4,654,754 | A | * | 3/1987 | Daszkowski ................ 361/708 |
| 4,689,720 | A | * | 8/1987 | Daszkowski ................ 361/704 |
| 4,961,106 | A | * | 10/1990 | Butt et al. .................. 257/710 |
| 5,052,481 | A | * | 10/1991 | Horvath et al. ............. 165/185 |
| 5,075,822 | A | * | 12/1991 | Baumler et al. ............. 361/710 |
| 5,309,979 | A | * | 5/1994 | Brauer ...................... 165/80.2 |
| 5,461,541 | A | * | 10/1995 | Wentland, Jr et al. ...... 361/707 |
| 6,131,646 | A | * | 10/2000 | Kelley ....................... 165/80.1 |
| 6,185,101 | B1 | | 2/2001 | Itabashi et al. ............ 361/704 |
| 6,225,559 | B1 | * | 5/2001 | Hubner et al. ............. 174/52.1 |

FOREIGN PATENT DOCUMENTS

| JP | A-4-243154 | 8/1992 |
| JP | A-11-186687 | 7/1999 |

OTHER PUBLICATIONS

U.S. application Ser. No. 09/615,756, Itabashi et al., filed Jul. 13, 2000.

* cited by examiner

Primary Examiner—Boris Chervinsky
(74) Attorney, Agent, or Firm—Law Offices of David G. Posz

(57) ABSTRACT

A semiconductor device has a case, a printed circuit board, a fin, and a ceramic substrate mounting a semiconductor element thereon. The case contains the printed circuit board, the ceramic substrate and the fin. The fin and the case radiate heat transmitted from the ceramic substrate. The fin has protrusions on a contact face facing a contact face of the case. The fin contacts the case though the protrusions when the fin is fixed to the case. The protrusions serve as heat radiating path.

9 Claims, 5 Drawing Sheets

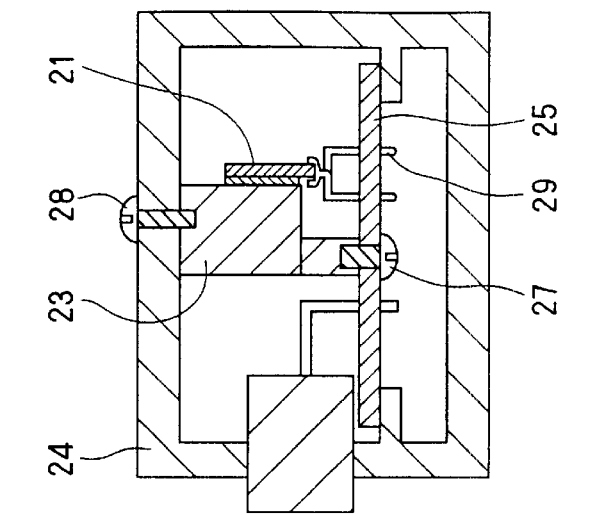
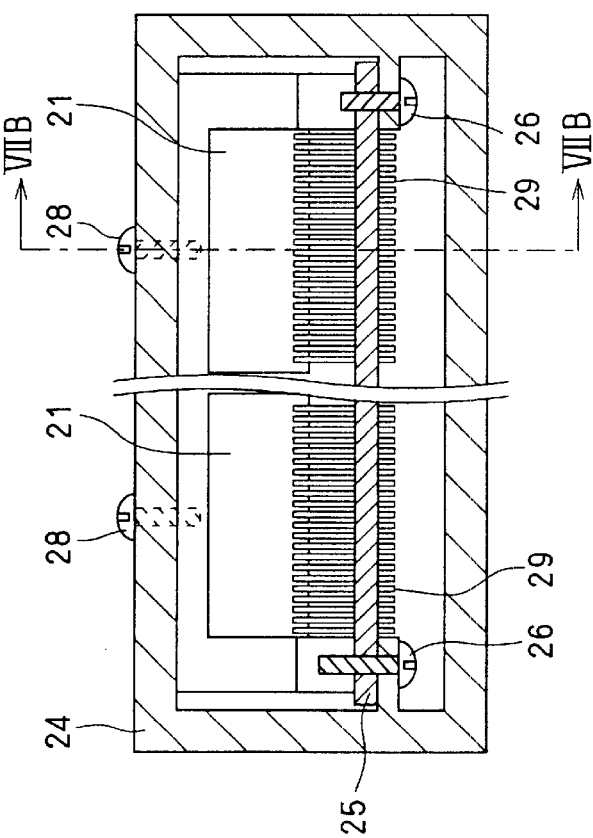

US 6,434,006 B1

SEMICONDUCTOR DEVICE HAVING HEAT RADIATING MEMBER

CROSS REFERENCE TO RELATED APPLICATIONS

This application is based upon Japanese Patent Application Nos. 2000-140554 filed on May 12, 2000, and 2001-72444 filed on Mar. 14, 2001, the contents of which are incorporated herein by reference.

BACKGROUND OF THE INVENTION

1. Field of the Invention

This invention relates to a semiconductor device having a ceramic substrate on which a semiconductor element is disposed, and a heat radiating member which is fixed to the ceramic substrate so that the heat radiating member radiates heat transferred through the ceramic substrate.

2. Description of the Related Art

Recently, semiconductor devices have been required to satisfy high performance, for example, large scale integration and application of high power thereto. Accordingly, power consumption in the semiconductor devices may increase with the large scale integration and the high power application.

On the other hand, while a base plate on which a semiconductor element is disposed and a case in which the semiconductor element is contained are required to be miniaturized.

Therefore, it is difficult to radiate heat from the semiconductor device sufficiently because of the increase of the power consumption and a decrease of a radiating heat area in the device based on the miniaturization.

A prototype as shown in FIGS. 7A to 7C was studied to solve the above-mentioned problem. FIG. 7A shows a cross sectional view of a ECU (Electric Controlling Unit) for a vehicle as the semiconductor device. FIG. 7B is a cross sectional view taken along line VIIB—VIIB in FIG. 7A.

A ceramic substrate 21 constituting a hybrid IC (Integrated Circuit) that includes an LSI and a high power IC is disposed on a printed circuit board 25 through lead terminals 29 which electrically connect the hybrid IC and the printed circuit board 25. Moreover, the ceramic substrate 21 is fixed to a fin (heat radiating member) 23 directly. The ceramic substrate 21, the printed circuit board 25, and the fin 23 are collectively disposed in a case 24.

In this structure, heat radiation can be improved by fixing the ceramic substrate having the hybrid IC directly to the heat radiating fin 23.

Incidentally, the printed circuit board 25 is fixed to the case 24 by using screws 26. Similarly, the fin 23 is fixed to the case 24 and the printed circuit board 25 by using screws 27, 28. Accordingly, the heat radiating fin 23 contacts an inner wall of the case 24 when the fin 23 is fixed to the case 24 as shown in FIGS. 7A and 7B. Therefore, heat generated in the ceramic substrate 21 by semiconductor elements in the power IC is externally radiated from the case 4 through the fin 23. In addition, even when the case 24 holds several ceramic substrates, a whole dimension of the case 24 can be miniaturized by fixing the several ceramic substrates to the fin 23 in common.

Usually, a surface of the printed circuit board and each electrically connecting portion are covered and protected by a moisture-proof material such as a humid-sealing. The portion which needs a moisture-proof described above is covered by the moisture-proof material that is coated by spray and the like after the ceramic substrate 21 and the fin 23 are mounted on the printed circuit board 25. Then, the printed circuit board 25 is put in the case 24. Therefore, the moisture-poof material adheres to the fin 23 or the case 24 occasionally. FIG. 7C is a enlarged view showing a portion around a contacting interface between the case 24 and the fin 23.

Usually, moisture-proof material has a heat insulating characteristic. Therefore, in the case that a moisture-proof material K0 adheres to the interface between the case 24 and the fin 23, heat radiation of the device becomes worse because heat resistance between the case 24 and the fin 23 increases by the moisture-proof material K0.

To avoid adhering of the moisture-proof material to the interface between the case 24 and the fin 23, a rigorous process control or special structure is required. Thus, it may take much time to assemble the printed circuit board 25 and the case 24, or structure of the fin 23 or the case 24 becomes complicated.

In addition, the heat radiation of the device also become worse in the case that a contact surface of the case 24 or the fin 23 is deformed by an error in process, that is, in the case that the contact surface is not flat. This is because a contact area between the case 24 and the fin 23 is reduced. Thus, accuracy in processing of the case 24 and the fin 23 is required to make the contact surface flat.

SUMMARY OF THE INVENTION

This invention has been conceived in view of the background as described above and an object of the invention is to provide a semiconductor device in which heat radiating path is secured.

According to the invention, protrusions are formed on at least one of surfaces of a body member of a semiconductor device such as a case and a heat radiating member fixed to the body member. The heat radiating member contacts the body member through the protrusions. The protrusions serve as a heat radiating path.

Other objects, features and advantages of the present invention will become more apparent from the following detailed description made with reference to the accompanying drawings.

BRIEF DESCRIPTION OF THE DRAWINGS

FIG. 7A is a schematic cross sectional view of a semiconductor device as a prototype;

FIG. 7B is a schematic cross sectional view showing the semiconductor device taken along line IIVB—IIVB in FIG. 7A; and FIG. 7C is an enlarged sectional view showing a portion of an interface between a case 4 and a fin 3 of the semiconductor device.

DESCRIPTION OF THE EMBODIMENTS

Figure 1:
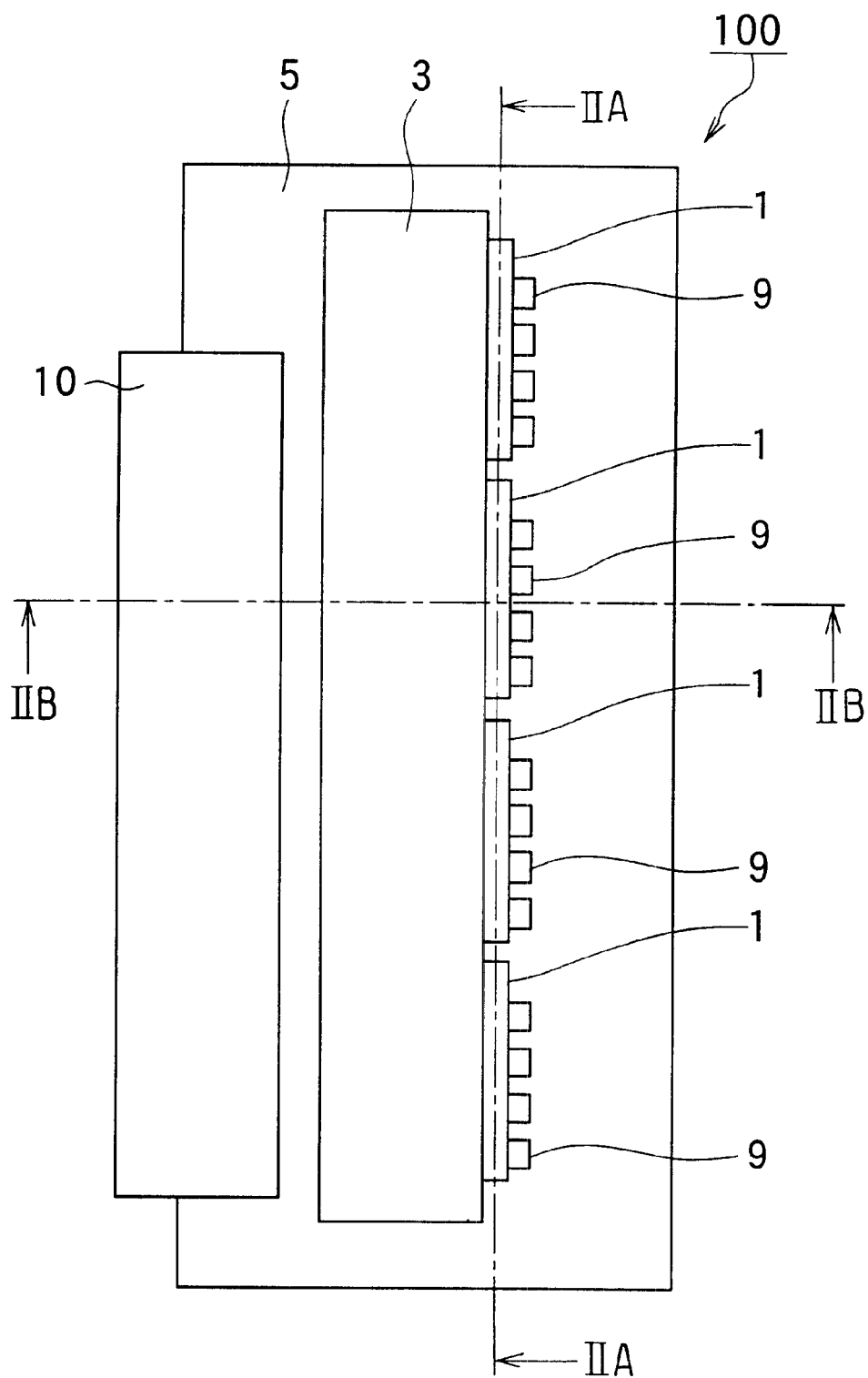
FIG. 1 is a schematic plan view showing a semiconductor device of a first embodiment.

Specific embodiments of the present invention will now be described hereinafter with reference to the accompanying drawings in which the same or similar component parts are designated by the same or similar reference numerals.

Figure 2A:
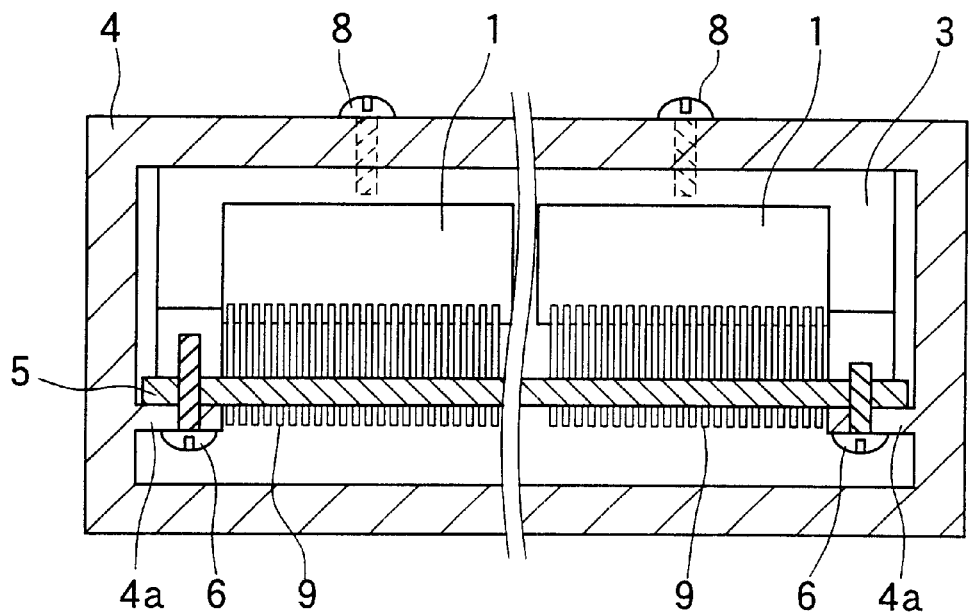
FIG. 2A is a schematic cross sectional view showing the semiconductor device taken along line IIA—IIA in FIG. 1.
Figure 2B:
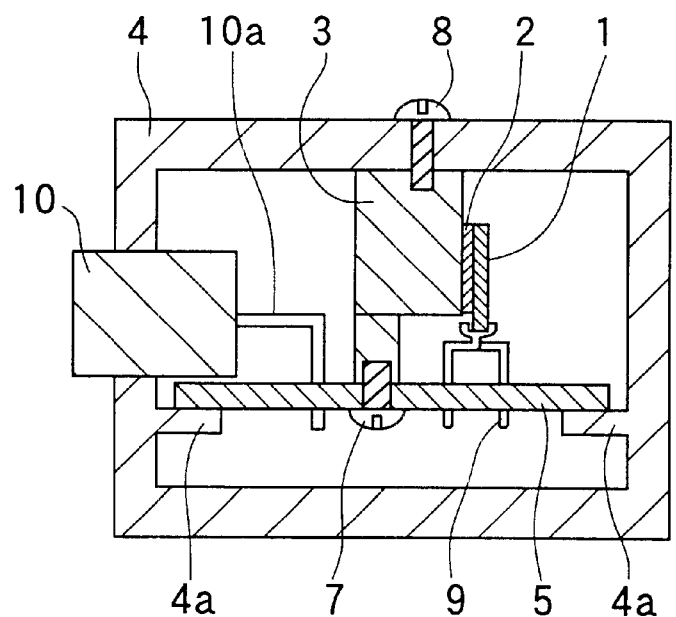
FIG. 2B is a schematic cross sectional view showing the semiconductor device taken along line IIB—IIB in FIG. 1.

Referring to FIGS. 1, 2A and 2B, a semiconductor device 100 is utilized for an ECU for a vehicle, for example.

A ceramic substrate 1, which is made of alumina or the like having a good heat radiating characteristic, constitutes a hybrid IC (HIC). Electric parts such as semiconductor elements, resistors or capacitors (not shown) are mounted on or formed on the ceramic substrate 1. The ceramic substrate 1 is fixed to a fin (heat radiating member) 3 having a block shape with an adhesion 2 made of silicone rubber and the like. The fin 3 is made of a metal having a good heat radiating characteristic, such as aluminum.

The ceramic substrate 1 and the fin 3 are put in a case 4 which is made of a metal having a good heat radiating characteristic, such as aluminum. A printed circuit board 5 is also put in the case 4. The printed circuit board 5 is supported by the case 4 at supporting portions 4a. Screws 6 fix the printed circuit board 5 to the case 4.

The fin 3 is pinched between the inner wall of the case 4 and the printed circuit board 5, and is fixed to the case 4 and the printed circuit board 5 respectively with a screw 8 and a screw 7. Accordingly, the fin 3 is fixed to the case 4 in contact with the inner wall of the case 4.

The ceramic substrate 1 fixed to the fin 3 is electrically connected to the printed circuit board 5 through plural lead terminals 9. A connecter 10, which is electrically connected to an external device (not shown), is provided with the case 4 so that the connecter 10 penetrates a wall of the case 4. The connecter 10 is electrically connected to the printed circuit board 5 through a lead portion 10a thereof disposed in the case 4.

The semiconductor device 100 includes the ceramic substrate 1, the fin 3 and the printed circuit board 5 electrically connected to the ceramic substrate 100 in the case 4. Moreover, the fin 3 contacts and is fixed to the case 4. In this semiconductor device 100, heat generated by the semiconductor elements and the like or by the ceramic substrate 1 is transmitted by fin 3 to the case 4, and is radiated from the case 4.

The semiconductor device 100 is assembled as follows.

First, the fin 3 mounted on the ceramic substrate 1 is fixed to the printed circuit board 5 by the screw 7. Next, the ceramic substrate 1 and the connecter 10 are electrically connected to the printed circuit board 5. Next, the printed circuit board 5 and electrical connecting portions are protected by a moisture-proof material such as a humid-sealing that is sprayed to the surface of the printed circuit board 5. Then, the printed circuit board 5 on which the parts such as the fin 3 is mounted and to which the moisture-proof material is applied is put in the case 4, and the printed circuit board 5 and the fin 3 are fixed to the case 4 by the screws 6 and 8 respectively, so that the semiconductor device 100 is assembled.

Figure 3A:
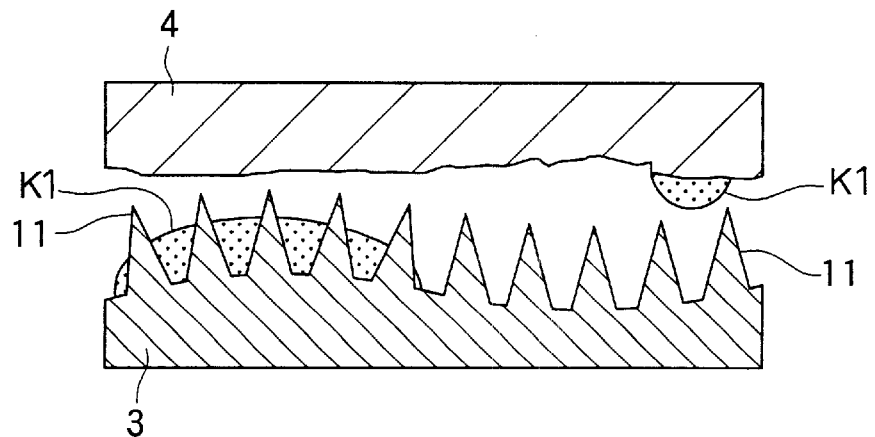
FIG. 3A is an enlarged sectional view showing a portion of an interface between a case 4 and a fin 3 of the semiconductor device.
Figure 3B:
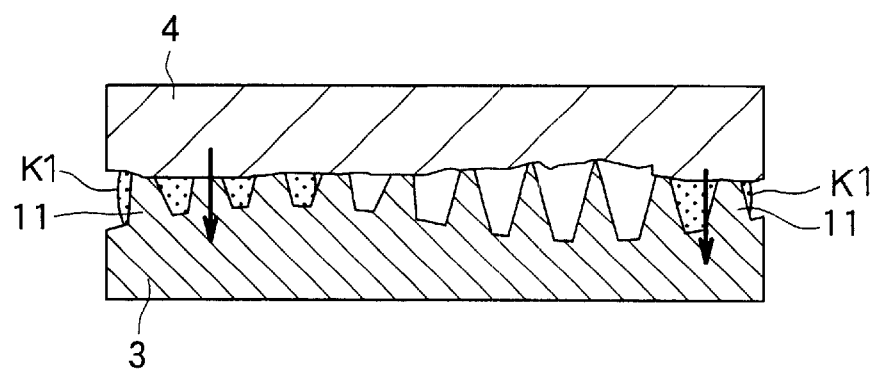
FIG. 3B is an enlarged sectional view showing a portion of an interface between a case 4 and a fin 3 of the semiconductor device.

FIGS. 3A and 3B show an interface between the case 4 and the fin 3. Especially, FIG. 3A shows a state before the fin 3 is fixed to the case 4 by the screw 8, while FIG. 3B shows a state after the fin 3 is fixed to the case 4 by the screw 8. A contact face of the fin 3 (heat radiating member) contacting the case 4 is formed in concavity and convexity shape like a saw blade. That is, the contact face (protuberant surface) of the fin 3 has protrusions (protuberant members) 11 as convex portions protruded from the contact surface of the fin 3. In other words, the protrusions 11 extend from the contact surface of the fin 3. Incidentally, the protrusions 11 are formed by a cutting process or a die process. In other words, the protrusions 11 are made of material the same as that of fin 3.

The protrusions 11 contact a contact face of the case 4 so that the sharp tip portions of are deformed by screwing up the fin 3. A moisture-proof material K1 may be adhered to the contact face of the fin 3 or the case 4 when the moisture-proof material is applied to the printed circuit board 5 and the electrical connecting portions, or when the printed circuit board 5 is put in the case 4.

However, even if the moisture-proof material K1 is disposed on the contact face, the protrusions 11 thrust the moisture-proof material K1 away to contact the case 4 sufficiently. Namely, the tip portions of the protrusions 11 contact the case 4 by deforming themselves. Even if the contact face of the fin 3 or the case 4 has an undulation, that is, even if the contact face of the fin 3 or the case 4 is not flat, the contact area is secured because the fin 3 comes in contact with the case 4 with deforming the tip portions of the protrusions 11.

In other words, the contact area between the fin 3 and the case 4 becomes enough to radiate the heat by approximately controlling a number and a size or a degree of deforming of the protrusions 11. In this embodiment, a heat radiating path between the fin 3 and the case 4 is secured by a simple structure such as the protrusions 11 extending from the contact face of the fin 3. Incidentally, protrusions are also formed on the contact face of the case 4 instead of the contact face of the fin 3 by the cutting process or the die process.

Figure 4:
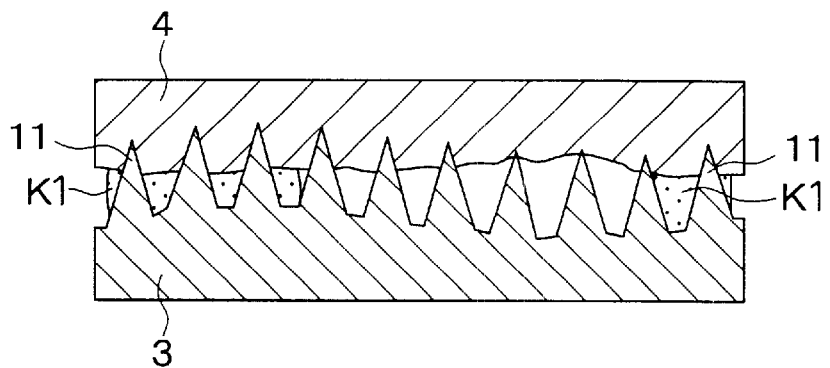
FIG. 4 is an enlarged sectional view showing a portion of an interface between a case 4 and a fin 3 of the semiconductor device.

In addition, as shown in FIG. 4, the tip portions of the protrusions 11 may be stuck into the contact face of the case 4 to contact the case 4. In this case, the contact area is secured by the tip portions stuck into the contact face of the case 4. The tip portions of the protrusions 11 can be stuck into the case 4 when the fin 3 is harder than the case 4 (in the case that the case 4 is made of resin, for example).

Figure 5:
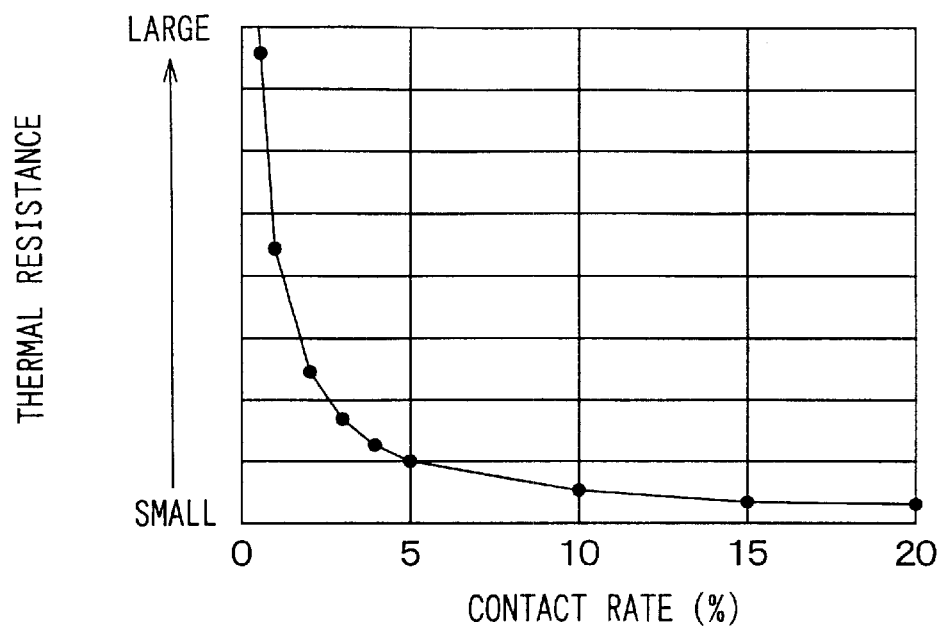
FIG. 5 is a graph showing a relationship between contact rate between the case 4 and the fin 3 and thermal resistance between the case 4 and the fin 3.

FIG. 5 shows a relationship between heat resistance generated between the case 4 and the fin 3, and a contact rate between the case 4 and the fin 3. Here, the contact rate represents a ratio of an area of the tip portions of the protrusions 11 (a height of the protrusions is, for example, 0.3 mm) contacting the contact face of the case 4 with respect to an entire area of the contact face of the fin 3.

When the contact rate is 10%, the heat resistance is reduced by about 50% in comparison with the case that the contact rate is 5%. It is preferable that the contact rate is approximately 10% or more to secure heat radiating characteristic in practical use.

In addition, since heat radiating characteristic of the semiconductor device 100 is improved by the protrusions 11, the ceramic substrate 1 and the fin 3 can be disposed in the vicinity of the connecter 10 in the ECU, for example.

Thus, wiring resistance in the semiconductor device 100 can be reduced, so that power saving can be achieved in the semiconductor device 100. Moreover, it becomes possible to miniaturize the printed circuit board 5, the heat radiating area in the semiconductor device 100, and the dimensions of the semiconductor device 100 conclusively.

Figure 6A:
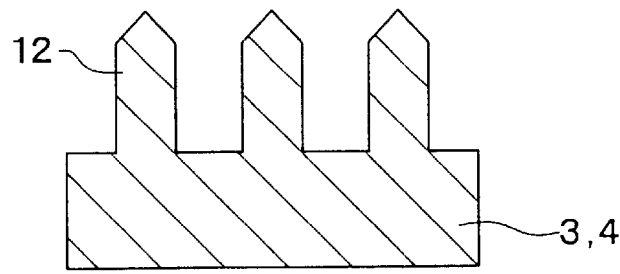
FIGS. 6A and 6B are other examples showing protrusions of the case or the fin.
Figure 6B:
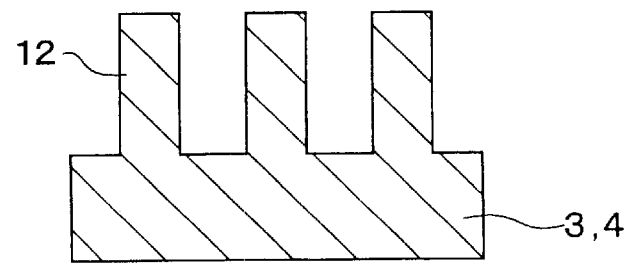

Incidentally, each protrusion 12 may have a pointed tip portion or a flat tip portion. Namely, a shape of the each protrusion 12 may be a pencil-like shape or in a rectangular shape as shown in FIGS. 6A and 6B. In other words, the protrusions 12 may be a member extending from the contact surface of the fin 3 or the case 4 and having a point, or a member extending from the contact surface of the fin 3 or the case 4 and having a flat top.

In the case that tip portions of the protrusions 11 shown in FIGS. 6A and 6B contact the contact face of the fin 3 or the case 4 by being deformed or stuck into the contact face when the fin 3 is attached to the case 4, the heat radiating path is secured between the fin 3 and the case 4.

Incidentally, the fin 3 may be fixed to the case 4 by another manner except a screw.

Such changes and modifications are to be understood as being within the scope of the present invention as defined by the appended claims.

What is claimed is:

1. A semiconductor device comprising:
   a substrate having a semiconductor element;
   a heat radiating member for radiating heat transmitted from the substrate; and
   a body member supporting the substrate and the heat radiating member;
   wherein a contact surface of one of the heat radiating member and the body member is a protuberant surface,
   wherein the heat radiating member contacts the body member through the protuberant surface.

2. A semiconductor device according to claim 1, wherein:
   the protuberant surface is formed in a saw blade-like shape having concavity portions and convexity portions.

3. A semiconductor device according to claim 1, wherein:
   tip portions of the protuberant surface are deformed when the heat radiating member is fixed to the body member.

4. A semiconductor device according to claim 1, wherein:
   tip portions of the protuberant surface are stuck into an opposing contact surface when the heat radiating member is fixed to the body member.

5. A semiconductor device according to claim 1 further comprising a screw for laying the heat radiating member and the body member so that the tip portions of the protuberant surface are deformed or stick into an opposing contact surface.

6. A semiconductor device according to claim 1, wherein the semiconductor element is mounted on the substrate.

7. A semiconductor device according to claim 1, wherein the body member is a case containing the substrate and the heat radiating member.

8. A semiconductor device according to claim 1, wherein the protrusions extend from the one of contact surfaces.

9. A semiconductor device comprising:
   a substrate having a semiconductor element;
   a heat radiating member for radiating heat transmitted from the substrate;
   a body member for supporting the substrate and the heat radiating member; and
   protuberant members formed on a surface of one of the radiating member and the body member, for contacting to the surface of the heat radiating member and a surface of the body member by deforming themselves or sticking into an opposing surface.

* * * * *